(12) United States Patent  (10) Patent No.: US 9,389,253 B2
Costa  (45) Date of Patent: Jul. 12, 2016

(54) SYSTEM AND METHOD FOR REAL TIME DETECTION AND CORRELATION OF DEVICES AND POWER OUTLETS

(75) Inventor: Mario Costa, Davie, FL (US)

(73) Assignee: AVOCENT HUNTSVILLE CORP., Huntsville, AL (US)

( * ) Notice: Subject to any disclaimer, the term of this patent is extended or adjusted under 35 U.S.C. 154(b) by 482 days.

(21) Appl. No.: 14/005,610

(22) PCT Filed: Mar. 5, 2012

(86) PCT No.: PCT/US2012/027375
§ 371 (c)(1),
(2), (4) Date: Sep. 17, 2013

(87) PCT Pub. No.: WO2012/128912
PCT Pub. Date: Sep. 27, 2012

(65) Prior Publication Data
US 2014/0002055 A1    Jan. 2, 2014

Related U.S. Application Data

(60) Provisional application No. 61/454,012, filed on Mar. 18, 2011.

(51) Int. Cl.
*G01R 31/08* (2006.01)
*G06F 1/26* (2006.01)
*G01R 21/00* (2006.01)
*G06F 11/30* (2006.01)

(52) U.S. Cl.
CPC ............ *G01R 21/00* (2013.01); *G06F 11/3006* (2013.01); *G06F 11/3058* (2013.01); *G06F 11/3062* (2013.01); *G06F 11/3072* (2013.01)

(58) Field of Classification Search
CPC .... G01R 33/385; G01R 33/543; G01R 21/06; G01R 27/2611; G01R 19/2513; G01R 19/0092; G01R 19/0084; G01R 21/00; G06F 19/00; H02J 3/14; H02J 1/14; Y10T 307/461; H04B 3/546; H04B 3/56; H04B 2203/5433; H04B 2203/5454; H04B 2203/5491
USPC ......... 324/508, 76.11, 510–511, 764.01, 771, 324/322, 500, 654, 649, 600
See application file for complete search history.

(56) References Cited

U.S. PATENT DOCUMENTS 8,487,634 B2 * 7/2013 Masters ................... H02J 3/14
  324/512
2007/0155349 A1    7/2007 Nelson et al.
(Continued)

OTHER PUBLICATIONS

International Search Report and Written Opinion for PCT/US2012/027375, mailed Sep. 25, 2012; ISA/KR.

*Primary Examiner* — Patrick Assouad
*Assistant Examiner* — Taqi Nasir
(74) *Attorney, Agent, or Firm* — Harness, Dickey & Pierce, P.L.C.

(57) ABSTRACT

A system for monitoring and detecting identities of electronic devices, where each of the electronic devices generates unique power up signature during its power up sequence. The system may make use of a plurality of power outlets that each has a specific identification designation, with each one of the electronic devices being assigned to a specific one of the power outlets. A processor may be used which is configured to read the power up signature of a given one of the electronic devices during its power up sequence, when the given electronic device is plugged into a given one of the power outlets and is powering up. The processor may use a stored power up signature for the given power outlet, together with the power up signature read for the given electronic device, to determine if the given electronic device is using its assigned power outlet.

20 Claims, 4 Drawing Sheets

(56) References Cited

U.S. PATENT DOCUMENTS

| | | |
|---|---|---|
| 2009/0263999 A1 | 10/2009 | Onoue |
| 2010/0145542 A1 | 6/2010 | Chapel et al. |
| 2010/0305773 A1 | 12/2010 | Cohen |
| 2011/0213510 A1* | 9/2011 | Mozayeny ......... A61M 5/1723 700/297 |

* cited by examiner

SYSTEM AND METHOD FOR REAL TIME DETECTION AND CORRELATION OF DEVICES AND POWER OUTLETS

CROSS-REFERENCE TO RELATED APPLICATIONS

This application claims the benefit of U.S. Provisional Application No. 61/454,012, filed on Mar. 18, 2011. The entire disclosure of the above application is incorporated herein by reference.

FIELD

The present disclosure relates to data center systems and devices, and more particularly to a system and method for detecting, in real time, when a device is plugged into a specific power outlet receptacle, and making a determination if the device just plugged in is a specific device that has been pre-assigned to the specific power outlet receptacle that it has been plugged into.

BACKGROUND

The statements in this section merely provide background information related to the present disclosure and may not constitute prior art.

Modern day data centers often make use of a large number of data center devices and components including various manufacturers' servers, routers and processors, just to name a few. Such components are often mounted in an equipment rack. Each equipment rack often has a power strip associated with it, with each power strip typically having a plurality of power outlets (also sometimes called "power receptacles") that allow an AC power plug for each device to be plugged into the power strip. One specific form of highly intelligent power strip is known as a power distribution unit ("PDU"). The Liebert Corporation (an Emerson Network Power company), is a leading manufacturing of PDUs.

In a data center environment, challenges can arise in tracking which components have their power cords plugged into specific power outlets of a multi-outlet power strip or PDU. For example, when one specific piece of equipment that was initially installed in an equipment rack, and plugged into one specific power receptacle of a power strip or PDU, is removed therefrom and a different piece of equipment, having different power draw and cooling requirements, is reinstalled in the equipment rack and plugged into the same power outlet, this can give rise to situations where the data center manager is unaware that an equipment configuration change has been made to the rack. This could potentially be detrimental to the other equipment in the rack if the newly added component has a power draw requirement that exceeds a safety margin set for the rack.

Another challenge is for the PDU to determine, in real time, whether the same piece of equipment has been reinstalled in the equipment rack and plugged into the same power outlet as the component that was previously removed from the rack. Still another challenge is for the PDU to identify specific ones of a group of similar components, such as a plurality of the same model of servers, when a first component of the group is unplugged from an outlet and a different component from the same group is reinstalled in the rack and plugged into the same outlet. When such equipment changes are made at the rack level and data center management personnel are not apprised of the change, this can add significantly to the difficultly in managing the data center environment. Specifically, it can complicate the data center manager's task of ensuring that all equipment racks are actually configured with the equipment that the data center management believes them to be. If a problem should develop with the components in a given rack, previously made changes to the rack where certain pieces of equipment were removed and replaced with different types of equipment can add significant difficulty in troubleshooting the problem.

SUMMARY

In one aspect the present disclosure relates to a system for monitoring and detecting identities of electronic devices, where each of the electronic devices have a unique power up signature during its power up sequence. In one embodiment the system may comprise a plurality of power outlets, with each power outlet having a specific identification designation and each one of the electronic devices being assigned to a specific one of the power outlets. A processor may be used which is configured to read the power up signature of a given one of the electronic devices during a power up sequence of the given one of the electronic devices, when the given one of the electronic devices is plugged into a given one of the power outlets and is powering up. The processor may also be configured to use a stored power up signature for the given one of the power outlets, together with the power up signature read for the given one of the electronic devices, to determine if the given one of the electronic devices is using its assigned power outlet.

In another aspect the present disclosure may relate to a system for monitoring and detecting identities of electronic devices, where each of the electronic devices has a unique power up signature during its power up sequence. In one embodiment the system may comprise a power distribution system. The power distribution system may have a plurality of power outlets, with each power outlet having a specific identification designation and being assigned to a specific one of the electronic devices. The power distribution system may also have a processor that reads the unique power up signature, during a power up sequence, of each one of the electronic devices when the electronic devices are initially plugged into their assigned said power outlets. The power distribution system may also include an application that compares the read power up signature of each electronic device against a respective stored power up signature assigned to the power outlet that each electronic device is powered up from. The power distribution system may determine if each electronic device is being powered up from its assigned power outlet.

In still another aspect the present disclosure may relate to a method of detecting whether each one of a plurality of electronic devices is being powered up from an assigned one of a plurality of power outlets. In one implementation the method may comprise a plurality of operations including initially determining a power up signature for each one the electronic devices; storing the initially determined power up signatures in a memory; and assigning each one of the initially determined power up signatures to a specific one of the power outlets such that each initially determined power up signature is uniquely associated with a single one of the power outlets. When a given one of the plurality of electronic devices is plugged into a selected one of the plurality of power outlets, the power up signature of the given one of the plurality of electronic devices is read at the power outlet that the given one of the plurality of electronic devices begins drawing power from. The initially determined power up signature assigned to the power outlet that the given one of the plurality of electronic devices is drawing power from may then be obtained. A comparison may then be made between the obtained, initially determined power up signature and the read power up signature. A determination may then be made if the given one of the plurality of electronic devices is drawing power from the power outlet that it has been assigned to.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 4 is a graph illustrating one sample power waveform measurement, of a particular data center device, relative to time, to show what one power-up signature may look like.

DETAILED DESCRIPTION

Figure 1:
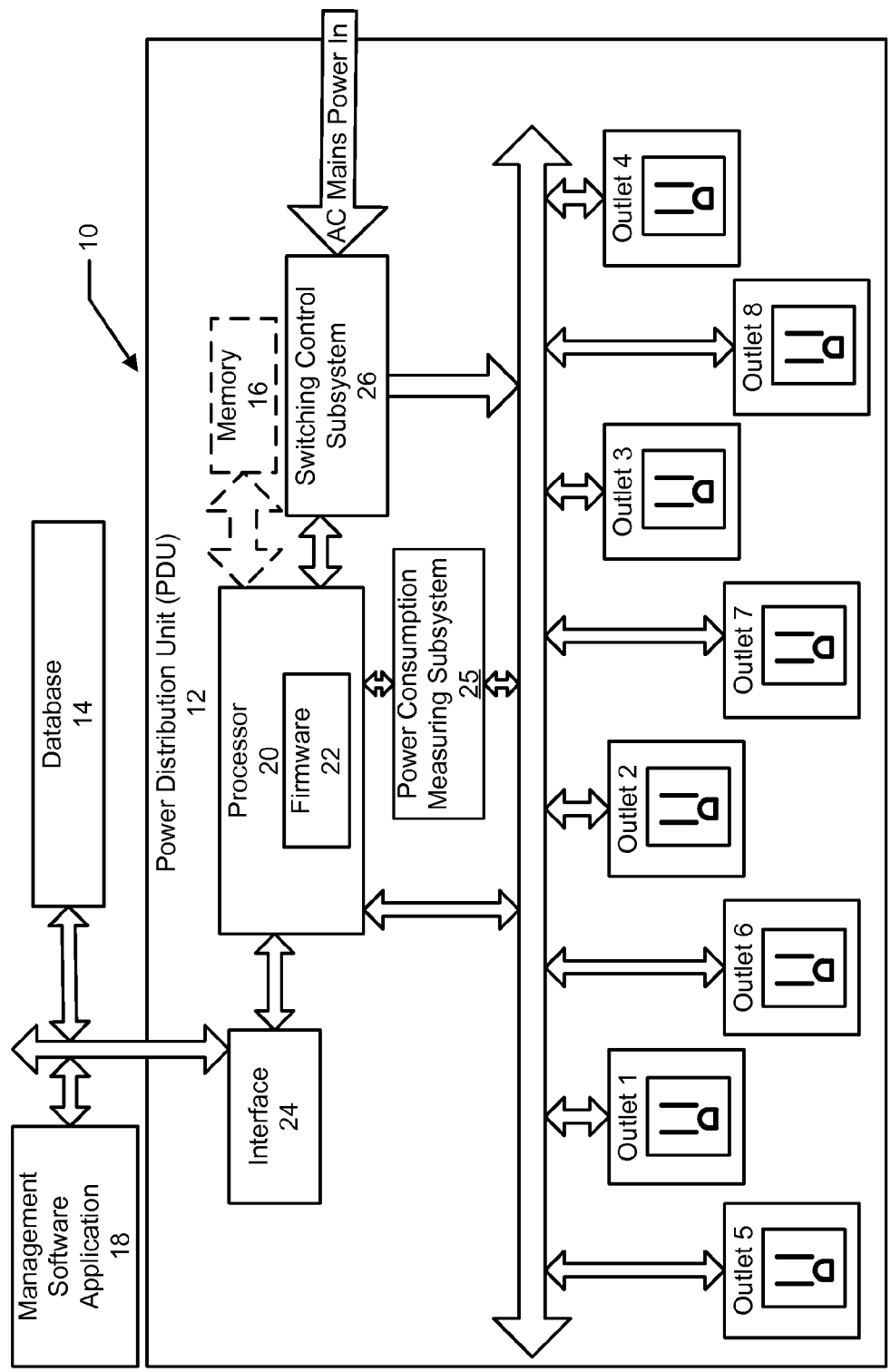
FIG. 1 is a high level block diagram of one embodiment of a system in accordance with the present disclosure.

The following description is merely exemplary in nature and is not intended to limit the present disclosure, application, or uses. It should be understood that throughout the drawings, corresponding reference numerals indicate like or corresponding parts and features.

Referring to FIG. 1 there is shown a system 10 for monitoring power outlets of a power distribution unit ("PDU") 12. As will be explained in greater detail in the following paragraphs, the system 10 is able to detect, in real time, when a specific component is plugged into a specific outlet of the PDU 12, and when that specific component is not a component that has been pre-assigned to use the specific outlet that it has been plugged into. Thus, the system 10 provides the data center manager with a powerful tool to monitor the configuration of equipment included in each equipment rack of a data center, and to potentially detect when unauthorized configuration changes have been made to an equipment rack.

Referring further to FIG. 1, the system 10 may include a database 14 remote from the PDU 12 for holding a unique power up "signature" code for each component that will be plugged into the PDU 12. In this regard it will be appreciated that when a component is plugged into one of the outlets of the PDU and power is initially applied, that the current draw of the component will present a unique, analog power up signature as the equipment goes through its power up (or boot) process. Thus, by the terminology "power up", it is meant the sequence of the component drawing current from a fully off state to a fully powered on state, as the component turns fully "on", over some relatively short period of time. This power up signature is unique for different types of equipment, and even for similar types of equipment that are made by different manufacturers. Thus, a server will have a different power up signature than a router. And two routers made by different manufacturers will also have different power up signatures. It is these unique power up signatures that may be stored in the database 14. Alternatively, the database 14 may be formed in a memory 16 of the PDU 12 itself. The system 10 may communicate with a management software application 18 so that the system is able to provide alerts or messages to a data center manager or other interested person when a specific piece of equipment has been plugged into, and is being powered up from, an outlet of the PDU that it has not been pre-assigned to use. Alternatively, the PDU 12 itself could easily incorporate some form of indicator that provides a visual signal (as well as possibly an audible signal) that one of its outlets has received a device that does not match a pre-assigned power signature ID code for that particular outlet.

The PDU 12 may include a processor 20 having firmware 22 that performs a real time comparison of a power up signature of a device, when the device is first plugged into any one of the outlets, with the power up signature code that is stored for that particular outlet. While the PDU 12 is shown in FIG. 1 as having eight power outlets, it will be appreciated that this is strictly intended as merely one example for the number of outlets that may be incorporated in the PDU 12. As such, a greater or lesser number of outlets may be incorporated, but typically eight or sixteen separate outlets will be provided with many present day PDUs. In one implementation the PDU 12 may have a sufficient capacity PDU (i.e., sufficient number of outlets) to cover 42 devices in a single equipment rack. An interface 24 enables the processor 20 to communicate with the management software application 18 and to send alerts to the application 18 when it detects that a device has been removed from a specific outlet, and also when a device has been plugged into a specific outlet that has a power up signature that differs from the power up signature code pre-assigned to that specific outlet. The interface 24 may take a variety of forms, for example an RS-232, an RS-422 interface, a network interface, or any other suitable form of interface. A power consumption measuring subsystem 25 may be in communication with the processor 20 to provide information to the processor on the amount of power being drawn by each one of the outlets.

The PDU 12 will typically include an AC power switching control subsystem 26 that controls the application of AC power from an AC power mains source to each of the outlets. The processor 20 may control the switching control subsystem 26 so that data center personnel can command that specific outlets be turned on or off. The processor 20 may optionally control the switching control subsystem 26 to turn off a specific outlet if a condition is detected by the system 10 where a component has been plugged into a specific outlet and has been powered up, but its power up signature did not match the power up signature code that is pre-assigned to that specific outlet.

Figure 2:
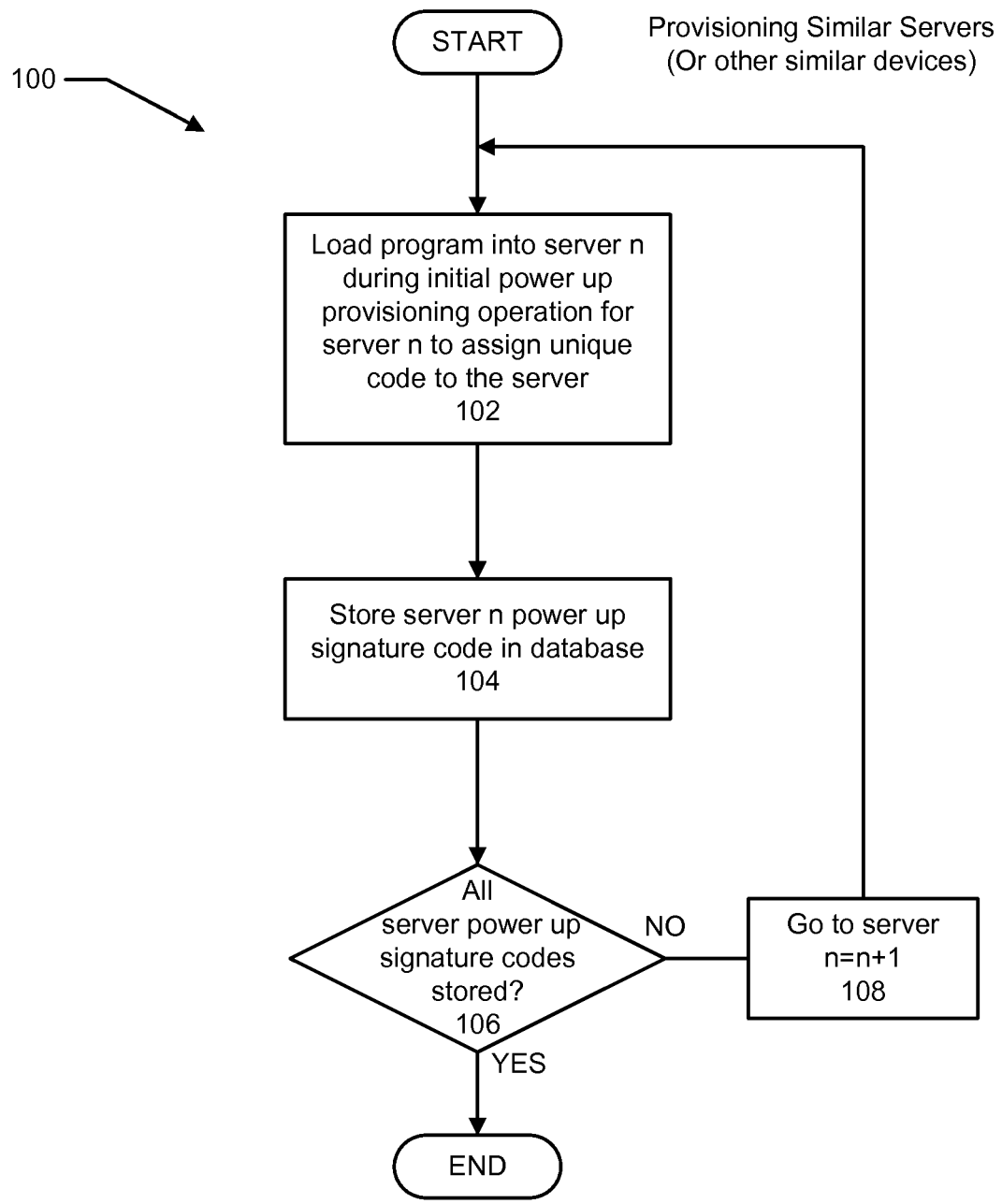
FIG. 2 is a high level flowchart of operations that may be performed in assigning a unique identification code to each one of a plurality of similar components, in this specific example a plurality of similar servers, that would otherwise have virtually identical power up signatures.

In FIG. 2 a flowchart 100 illustrates operations that may be performed in addressing the situation where similar or identical servers or other similar devices need to be provided with some form of identification code that uniquely identifies them from other similar or identical devices. In this regard it will be appreciated that a situation can easily exist where two or more devices, for example servers A and B from a given manufacturer, may have essentially the same power up signatures. Servers A and B may be the same model of server or possibly even different models, but their power up signatures may be virtually the same. Thus, there will be no way of identifying/distinguishing them from one another if the system 10 is looking strictly at their power up signatures. This situation is addressed by providing each server with a unique code during its provisioning process. In FIG. 2 a process for providing such a unique code to each server is provided. It will be appreciated that while FIG. 2 describes this process with reference to a plurality of servers, that the operations of FIG. 2 are not limited to just servers. Where two or more different devices or components, for example two or more different processors, are expected to be used with the system 10, but those components will have essentially identical power up signatures, and where there is a need to uniquely identify them once they are plugged into the PDU outlets, then the process shown in FIG. 2 may be used.

At operation 102 of FIG. 2 a pre-written program is loaded in the server that assigns a unique code to the server while the server is being provisioned. The unique code may a numerical code, such as specific number, or it may be an alphanumeric code, or any other type of code. In any event, the unique code will thereafter become a part of the power up signature of the server each and every time the server is powered up. Preferably the server will be provisioned so that the unique code will be arranged at the leading edge of its power up signature when the server powers up. At operation 104, the power up signature (including the newly introduced unique code) is stored in the database 14. At operation 106 a check is made if additional servers need to be configured with a unique, predetermined code. If so, then the next server is obtained, as indicated at operation 108, and operations 102-106 are re-performed. It will also be appreciated that a technician will typically be manually performing the operations described in connection with FIG. 2 using suitable electronic equipment by which the required unique codes can be loaded into the servers during the provisioning process.

Figure 3:
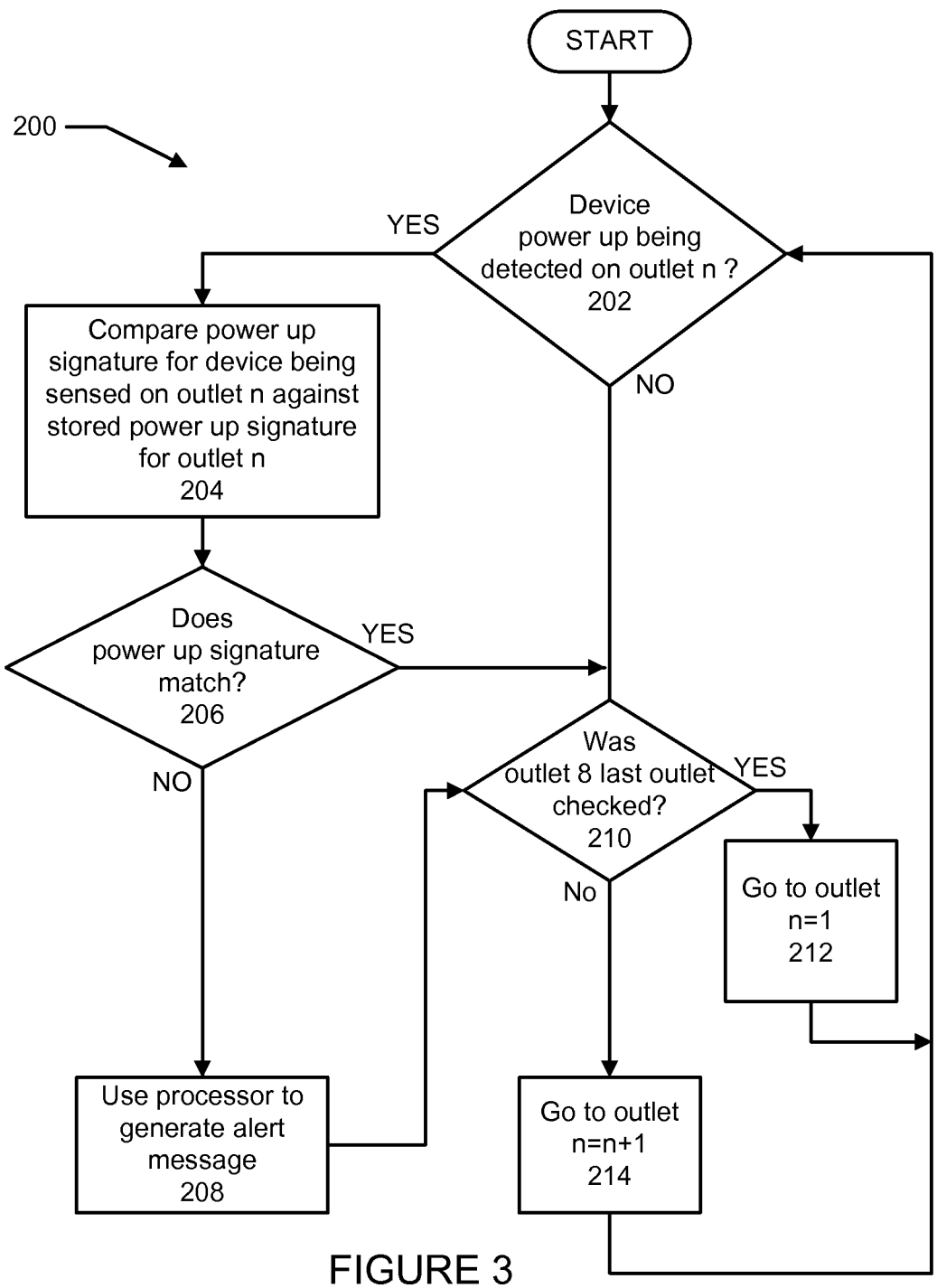
FIG. 3 is a high level flowchart of operations that may be performed by the methodology of the present disclosure, and the system of FIG. 1, in carrying out real time monitoring of the various power outlets of the PDU shown in FIG. 1.
Figure 4:
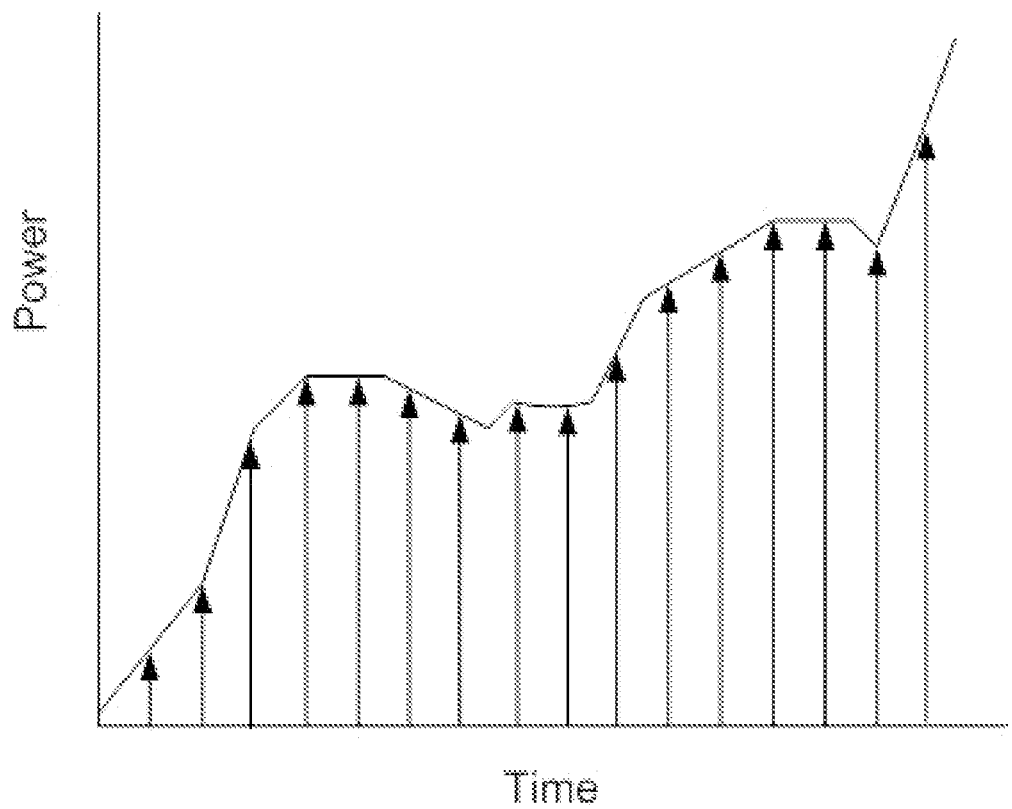

Referring now to FIG. 3, a high level flowchart 200 is shown that illustrates various operations that the system 10 may perform in monitoring and detecting, in real time, whether a specific component or device has been unplugged from one of the power outlets of the PDU 12 and re-plugged into a different one of the power outlets. The operations described in FIG. 3 assume that the system 10 is up and running and that at least one of the eight outlets of the PDU 12 is empty. It is further assumed that the processor 20 has been programmed with information, either in its firmware 22 or other software, which directs it to obtain the power up signature code stored at specific locations in the database 14 for specific ones of the eight outlets when making a power up signature comparison. Put differently, the processor 20 will be able to compare the exact power up signature code that should be seen on each one of the eight outlets whenever a device is powering up from any one of the eight outlets. If the system 10 is being powered up for the very first time, with various devices being plugged into the outlets of the PDU 12 for the first time, the processor 20 will simply record the measured power up waveforms as power up signature codes at specific locations in the database 14 for future comparison use.

At operation 202 the processor 20 checks outlet "n" to see if a power up signature is being detected. For example, assume that outlet n is outlet 1, and that a specific component is currently plugged into outlet 1. No power up signal will therefore be detected on outlet 1. In this event a check will then be made at operation 210 if the last one of the eight outlets (in this example outlet 8) was just checked. If the last outlet checked was not outlet 8, then at operation 214 the PDU 12 selects the next outlet to be checked, as indicated at operation 214, and repeats operation 202.

If the check at operation 202 detects that a power up signal is being generated at the outlet, meaning that a device has been plugged into the outlet and is being powered up, then the processor 20 of the PDU 12 will obtain the stored power up signature code for that particular outlet from the database 14. The processor 20 will then compare the stored power up signature code with the power up signature being detected, as indicated at operation 204. Advantageously, this comparison is performed in real time, and preferably within 10-20 milliseconds, and even more preferably within every 1 millisecond. The PDU 20 may perform the comparison by digitizing the analog waveform that is being detected and making a comparison of it against the stored power up signature code associated with that particular outlet. Alternatively, the processor 20 may simply take a series of voltage and/or current measurements at a series of predetermined time intervals, for example every few milliseconds, and may then compare the obtained measurements against data read from the database 14 that forms the power up signature code for that particular outlet. Any other suitable comparison methodology may also be employed. The precise comparison methodology may be implemented using the firmware 22 or other software running on the PDU 20. The processor 20 then makes a determination at operation 206 if the just-detected power up signature matches the stored power up signature code for that particular outlet. If it does not, then the processor 20 may generate an alert signal that is transmitted to the management software application 18 to immediately signal data center personnel of this condition. If at operation 206 the processor 20 detects that a match exists, then this indicates that a device that has been assigned to the presently checked outlet is being re-plugged into the outlet. The processor 20 may then continue with operation 210.

When the check at operation 210 indicates that the last outlet checked was outlet 8, then the next outlet selected for checking will be outlet 1, as indicated at operation 212, and operation 202 will be repeated. In this manner all the outlets of the PDU 12 are sequentially and repeatedly checked, for example every few milliseconds, to quickly detect when an available outlet is being used to power up a device.

It will also be appreciated that the foregoing description of operation could easily be modified so that the processor 20 generates a separate signal to the management software application 18 whenever it detects that any component is being plugged into any one of the outlets, along with an indication of the specific outlet that is receiving the newly powered up device. Still further, the processor 20 could be programmed to signal the management software application 18 whenever it detects that a device has been removed from a specific outlet. In this manner, data center personnel can be apprised of any instance where a device is removed from a specific outlet or plugged in to a specific outlet, as well as whether a newly powered up device has been plugged into its previously assigned outlet.

The system 10 and method of the present disclosure thus forms a convenient and easily implemented means for monitoring and detecting, in real time, whenever a device is plugged into a power outlet, and identifying if that specific device is different from a device that has been previously assigned to the specific power outlet. In this manner the predetermined equipment configuration for each rack of a data center can be monitored and maintained. The system can also help prevent those instances where one individual removes a specific device from a specific location within a rack, but then a different individual attempts to unknowingly reinstall that device at a different location in the same rack, or even in a different rack entirely. The system 10 is readily retrofittable to existing data centers and can be implemented without significant additional cost or otherwise significantly increasing the complexity of the data center itself.

While various embodiments have been described, those skilled in the art will recognize modifications or variations which might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. A system for monitoring and detecting identities of electronic devices, where each of the electronic devices has a unique power up signature during its power up sequence, the system comprising:
   a plurality of power outlets, each said power outlet having a specific identification designation and each one of the electronic devices being assigned to a specific one of the power outlets;
   a processor configured to:
      read the power up signature of a given one of the electronic devices, during a power up sequence of the given one of the electronic devices, when the given one of the electronic devices is plugged into a given one of the power outlets and is powering up; and
      to use a stored power up signature for the given one of the power outlets, together with the power up signature read for the given one of the electronic devices, to determine if the given one of the electronic devices is using its said assigned power outlet.

2. The system of claim 1, wherein the processor further includes an application that compares, in real time, the read power up signature of the given one of the electronic devices against the stored power up signature for the given one of the power outlets and determines in real time, from the comparison, if the given one of the electronic devices is using its said assigned power outlet.

3. The system of claim 1, wherein the processor and the power outlets are contained in a power distribution unit.

4. The system of claim 1, further comprising a management software application in communication with the processor and configured to receive a signal from the processor when the processor detects that the given one of the electronic devices has been powered up using a different one of the power outlets than the given one of the electronic devices has been assigned to use.

5. The system of claim 4, further comprising a data base in communication with the management application for storing predetermined power up signatures assigned to each of the power outlets.

6. The system of claim 1, further comprising a switching control subsystem in communication with the power outlets and with an AC mains power source, for selectively switching AC mains power on and off relative to each one of the power outlets based on signals from the processor.

7. The system of claim 1, further comprising an interface for interfacing the processor to a remote subsystem.

8. A system for monitoring and detecting identities of electronic devices, where each of the electronic devices has a unique power up signature during its power up sequence, the system comprising:
   a power distribution system having:
      a plurality of power outlets, each said power outlet having a specific identification designation and being assigned to a specific one of the electronic devices;
      a processor that reads the unique power up signature, during a power up sequence, of each one of the electronic devices when the electronic devices are initially plugged into their assigned said power outlets; and
      an application that compares the read power up signature of each said electronic device against a respective stored power up signature assigned to the power outlet that each said electronic device is powered up from, and determines if each said electronic device is being powered up from its said assigned power outlet.

9. The system of claim 8, wherein the power distribution system comprises a power distribution unit that receives AC power from an AC mains power source.

10. The system of claim 8, wherein the application comprises firmware that is run by the processor which is adapted to compare the read power up signature of each said electronic device against the respective stored power up for the power outlet that each said electronic device is being powered up from.

11. The system of claim 8, wherein the power distribution system comprises a switching control subsystem for selectively switching on and off a supply of AC mains power to each of said power outlets.

12. The system of claim 8, further comprising:
   a management software application for communicating with the power distribution system and receiving information from the power distribution system when the power distribution system identifies that a specific one of the electronic devices is being powered up from one of the outlets that it is not assigned to use; and
   a database in communication with the management software application for storing the power up signatures of each one of the electronic devices.

13. The system of claim 8, wherein the power distribution system further comprises an interface for interfacing the processor to at least one external subsystem.

14. A method of detecting whether each one of a plurality of electronic devices is being powered up from an assigned one of a plurality of power outlets, the method comprising:
   initially determining a power up signature for each one of the electronic devices;
   storing the initially determined power up signatures in a memory;
   assigning each one of the initially determined power up signatures to a specific one of the power outlets such that each said initially determined power up signature is uniquely associated with a single one of the power outlets;
   when a given one of the plurality of electronic devices is plugged into a selected one of the plurality of power outlets, reading the power up signature of the given one of the plurality of electronic devices at the power outlet that the given one of the plurality of electronic devices begins drawing power from;
   obtaining the initially determined power up signature assigned to the power outlet that the given one of the plurality of electronic devices is drawing power from;
   comparing the obtained, initially determined power up signature to the read power up signature and determining if the given one of the plurality of electronic devices is drawing power from the power outlet that it has been assigned to use.

15. The method of claim 14, wherein the operations of obtaining the initially determined power up signature and the comparing the obtained, initially determined power up signature to the read power up signature are performed in real time.

16. The method of claim 14, wherein the operation of obtaining the initially determined power up signature and the operation of comparing the obtained, initially determined power up signature to the read power up signature are performed by a processor sequentially monitoring power being drawn from all of the power outlets.

17. The method of claim 14, wherein the operation of obtaining initially determined power up signature and the operation of comparing the obtained, initially determined power up signature to the read power up signature are performed by an application stored in a memory, and running on a processor.

18. The method of claim 14, further comprising using a switching control subsystem to controllably apply and interrupt power from an AC power source to each of the power outlets.

19. The method of claim 14, further comprising communicating information to an external component when it is determined that the given one of the electronic devices is not being powered up from its said assigned power outlet.

20. The method of claim 14, further comprising locating the power outlets on a power distribution unit, and performing the operation of obtaining the initially determined power up signature and the operation of comparing the obtained, initially determined power up signature to the read power up signature by using a processor disposed within the power distribution unit.

* * * * *